(12) United States Patent
Mukherjee et al.

(10) Patent No.: US 7,975,244 B2
(45) Date of Patent: Jul. 5, 2011

(54) METHODOLOGY AND SYSTEM FOR DETERMINING NUMERICAL ERRORS IN PIXEL-BASED IMAGING SIMULATION IN DESIGNING LITHOGRAPHIC MASKS

(75) Inventors: Maharaj Mukherjee, Wappingers Falls, NY (US); James A. Culp, Newburgh, NY (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 12/019,125

(22) Filed: Jan. 24, 2008

(65) Prior Publication Data
US 2009/0193387 A1 Jul. 30, 2009

(51) Int. Cl.
*G06F 17/50* (2006.01)
(52) U.S. Cl. ............... 716/51; 716/50; 716/52; 716/53; 716/54; 716/55; 430/5; 430/30
(58) Field of Classification Search ............. 716/19–21, 716/50–55; 430/5, 30; 703/13–14
See application file for complete search history.

(56) References Cited

U.S. PATENT DOCUMENTS

| | | | |
|---|---|---|---|
| 5,740,068 A | | 4/1998 | Liebmann et al. |
| 5,976,741 A | * | 11/1999 | Ziger et al. ............ 430/30 |
| 6,077,310 A | | 6/2000 | Yamamoto et al. |
| 6,425,117 B1 | | 7/2002 | Pasch et al. |
| 6,602,728 B1 | * | 8/2003 | Liebmann et al. ......... 438/16 |
| 6,996,797 B1 | | 2/2006 | Liebmann et al. |
| 7,010,775 B2 | | 3/2006 | Ohmori |
| 7,010,776 B2 | | 3/2006 | Gallatin et al. |
| 7,043,712 B2 | | 5/2006 | Mukherjee et al. |
| 7,131,104 B2 | | 10/2006 | Gallatin et al. |
| 2003/0213613 A1 | * | 11/2003 | Strozewski et al. ......... 174/250 |
| 2005/0120327 A1 | * | 6/2005 | Ye et al. .................. 716/20 |

FOREIGN PATENT DOCUMENTS

WO WO9914638 3/1999

OTHER PUBLICATIONS

Doo-Youl Lee, et al., "Quantitative Evaluation of Grid Size Effect on Critical Dimension Uniformity Improvement", Japanese Journal of Applied Physics, Part 1, vol. 43, No. 6B, pp. 3680-3683, Date: Jun. 2004.- Abstract.
International Search Report dated Mar. 23, 2009.

* cited by examiner

*Primary Examiner* — Nghia M Doan
(74) *Attorney, Agent, or Firm* — Katherine S. Brown

(57) ABSTRACT

A method is provided for designing a mask that includes the use of a pixel-based simulation of a lithographic process model, in which test structures are designed for determining numerical and discretization errors associated with the pixel grid as opposed to other model inaccuracies. The test structure has a plurality of rows of the same sequence of features, but each row is offset from other rows along an x-direction by a multiple of a minimum step size, such as used in modifying masks during optical proximity correction. The images for each row are simulated with a lithographic model that uses the selected pixel-grid size and the differences between row images are compared. If the differences between rows exceed or violate a predetermined criterion, the pixel grid size may be modified to minimize discretization and/or numerical errors due to the choice of pixel grid size.

33 Claims, 16 Drawing Sheets

IMAGE SIMULATION AT TOTAL 225 POINTS

15 POINTS PER CUT LINE
IMAGE SIMULATION AT TOTAL 90 POINTS

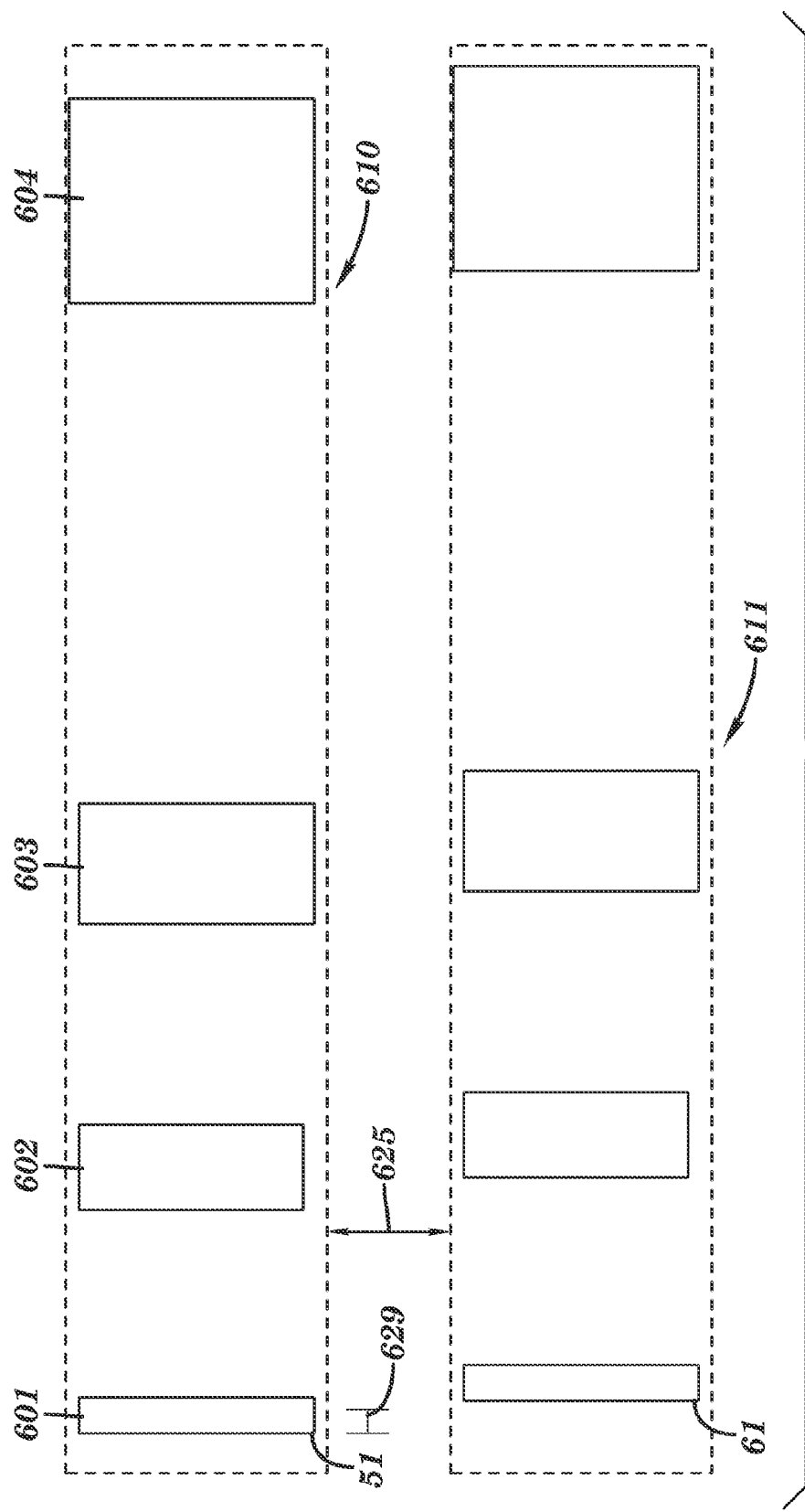

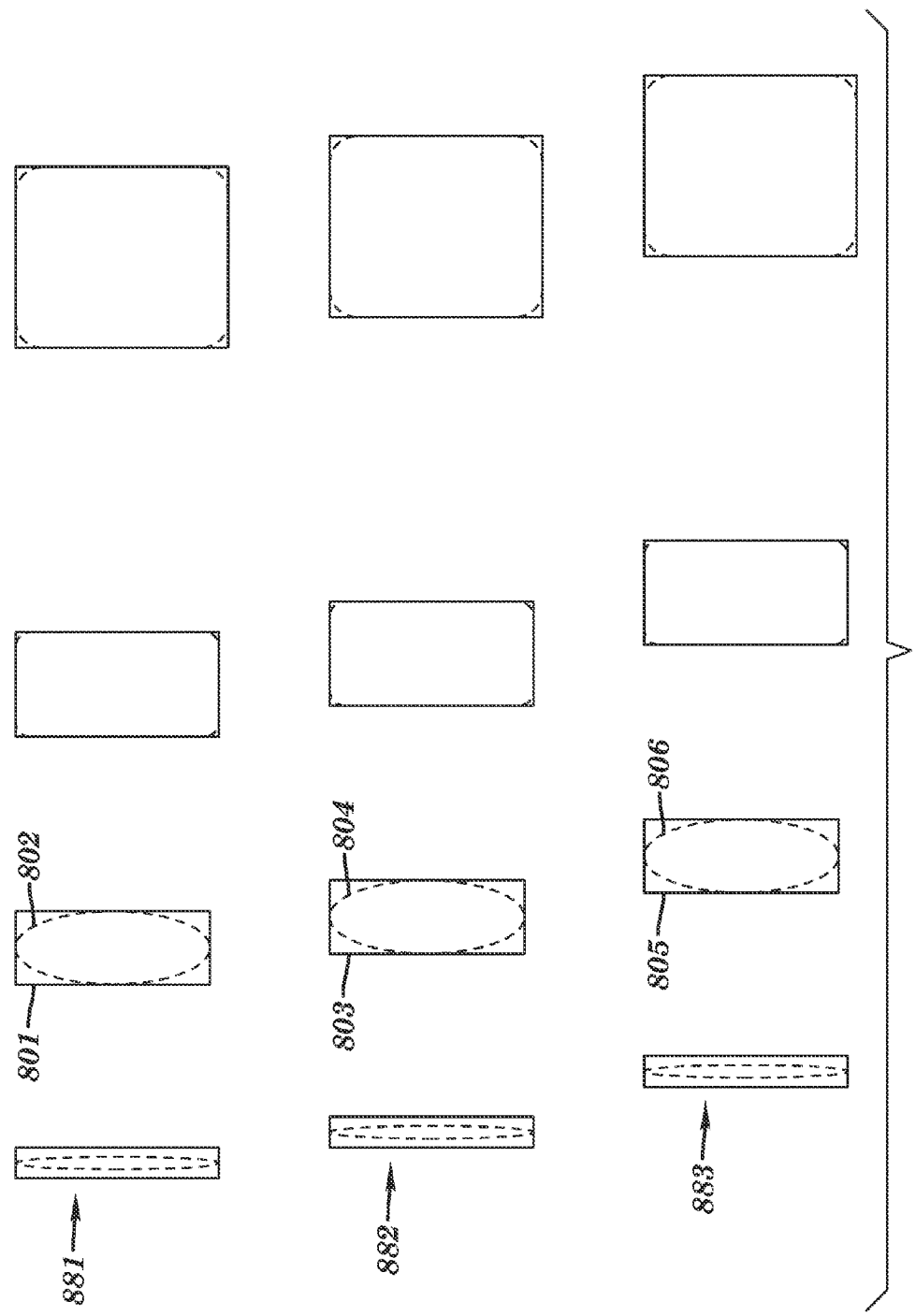

ns in pixel-based imaging simulation in designing lithographic masks

BACKGROUND OF THE INVENTION

1. Field of the Invention

The present invention generally relates to Very Large Scale Integrated (VLSI) circuit fabrication, and more particularly, to a method and system for determining numerical and discretization errors into a pixel based image simulation used in lithographic mask design.

2. Description of the Related Art

Considerable efforts have been made in the field of lithographic methods used in the manufacture of integrated circuits. The con design of masks used in optical lithographic y to develop and implement methods of mask compensation and verification, e.g., model-based optical proximity correction (MBOPC). MBOPC is integral to the mask design process, in which initial mask shapes are modified or "corrected" to compensate for distortions in the imaging process, as known in the art. The lithographic process model will include a model of the optical effects, and may also include a model of the resist process and other processes, such as the etch process. In MBOPC, the lithographic model is used to simulate the image of the mask shapes, and then the simulated images are compared to the target shapes desired to be printed on the wafer. If the differences between the simulated images and target shapes exceed predetermined criteria, then the mask shapes are modified and the process is repeated using the modified mask layout until the simulated images match the target shapes within acceptable tolerances.

Typically, the model images have been computed at evaluation points representing edge segments of mask shape edges. Fragment-based image simulations involve computing the image at or in the vicinity of a set of selected evaluation points to represent an edge fragment of mask feature polygons which, for example, are adjusted during OPC. Such edge fragments are typically unevenly spaced. However, as IC technology drives towards smaller and denser layouts, the computational cost of simulating images is becoming increasingly impractical.

An alternative method for performing lithographic image simulation is pixel-based simulation. A key aspect of this simulation approach is that the images of the projected mask patterns are calculated on a regular grid over the entire layout, which permits the use of more computationally efficient methods, such as Fourier transforms. However, the image contours that are defined by interpolating image intensity curves between pixel grid points.

In the OPC tool, the modification of mask shape edges are performed by adjusting the location of edge fragments in increments that are defined by the requirements of the mask manufacturing and inspection tools. These increments are referred to hereinafter as the OPC grid. The OPC grid element width A is the smallest line segment, according to mask manufacturability requirements, that is used to fragment and modify shape edges during the OPC process. The resolution of the OPC grid depends on the capabilities of the mask inspection tool and mask manufacturing tool. The mask shapes will be aligned to the OPC grid. For 45 nm technology, the OPC grid size is typically 0.25 nm, resulting in about 180 OPC grid elements per CD.

The advantage of pixel-based imaging relative to fragment-based imaging is explained in FIGS. 1A through 1D. FIG. 1A illustrates a rectangular mask shape 110 in a layout 105. In this example of fragment-based simulation, the optical and the resist image is simulated at 6 evaluation locations 111 as well as along cut-lines 103 running through each evaluation point 111. The number of image simulation points along each cut-line typically needed is about 15 image simulations for the complete optical and the resist image simulation. Therefore, for the case in 101, the number of points at which image would be simulated is 90 for six cut-lines.

The same layout 105 with the shape 110 in it is shown again in FIG. 1B in a pixel-based imaging method. In the pixel-based imaging method, the layout 105 is divided into uniform pixels 112 and image intensity is typically simulated at a point, e.g. the center point that represents the intensity of the pixel. In this example, image is simulated at 225 points. The pixels typically each have a uniform size along two orthogonal directions, x and y, but which need not be the same size in each direction. The selection of the size of the pixel grid elements is based on the effective resolution of the lithographic process, which is related to the Raleigh limit given by $\lambda/(4NA)$, where $\lambda$ is the wavelength of the illumination energy, NA is the numerical aperture. The pixel grid is given by $\alpha=\lambda/(k4NA)$ where k is a scaling or oversampling factor. For 45 nm technology, $\lambda=193$ nm. The numerical aperture of the optical system is typically about 1.2, but may range from about 0.45 to 1.3. The scaling or oversampling factor k is related to the development process, for example, the resist or etch processes. For a purely optical process, k=1. For chemically amplified resists, k is typically between about 1.5 to 2. The value of k is positive may be selected based on a speed-accuracy tradeoff. Large values of k can increase the accuracy of interpolation of the image values between computed pixel grid points but significantly add to the cost of computation. A pixel grid with k=1 represents the smallest unit at which the lithographic process can respond to a change in design information. Thus, for the case of 45 nm technology, using $\lambda=193$ nm, k=2, and NA=1.2, the size of a pixel grid element a may be chosen to be about 20 nm.

As feature size gets smaller with coming technologies, more and more shapes are accommodated in the same area of the mask. This is illustrated in FIGS. 1C and 1D. The layout 107 with the same area as layout 105 now accommodates three shapes 120. In this example of fragment-based imaging computation, as shown in FIG. 1C, there are 10 cut lines per shape totaling 30 cut lines. Assuming again there are 15 computation points needed per cut line, the fragment-based simulation would require a total of 450 image computations for the fragment-based simulation. On the other hand for the pixel-based image simulation, the same gridding may be used as shown in FIG. 1D, so that the number of image computations still remains 225, which is considerably smaller than the number of computations needed for the fragment-based simulation in FIG. 1C.

FIG. 1E to 1F further elaborates the above concept. In FIG. 1E, a mask shape 150, in this example, a rectangle having width 151 and length 152. Width 151 may be as small as the minimum resolvable width $w_1$ and the aspect ratio of length 152 to width is typically at least 4-5. For executing the fragment based Optical Proximity Correction, the edges of shape 150 is broken up into several edge segments 156. The end points 153 define the segments 156. The image corresponding to a segment 156 is typically evaluated at an evaluation point 154 that represents the image of the entire segment 156. Typically, the evaluation point 154 is located at the midpoint of a segment 156, but may be staggered, e.g. near corners of shapes. In resist process models, optical image characteristics besides image intensity at the evaluation point are also required. In order to compute these additional image characteristics, the optical image is typically computed along a cut-line 155 that is drawn through the evaluation point 154 which is typically orthogonal to the line segment 156. In the case of segments located near a corner, the cut-line 155 may be oriented along a non-orthogonal direction relative to the edge segment. The number of image computation points along the cut line needed to compute the resist image is about 10 to 20 points (typically 15) along the cut-line 155, which may be either uniformly or non-uniformly spaced. The length of a cut-line 155 is typically in the range 0.75 w1 to 1.5 w1.

After several iterations of OPC, the initial mask shape 150 has been modified as shape 160 (see FIG. 1F). The original segments 156 have been moved by the OPC tool to segments 166 in modified shape 160. The modified segments 166 are defined by end points 163 whose locations have been modified from the original locations 153. In the same manner, the image evaluation points 154 are modified to result in image evaluation points 164 after the OPC iterations, and the cut-lines 155 are modified to result in new cut-lines 165. The movement of the end points 153 to modified end points 163 is performed in increments that are along the smallest grid that is defined by the mask manufacturing capabilities. This minimum step size for modifying mask shapes in an OPC tool is referred to hereinafter as the "OPC grid". For example, the movement of an edge segment 156 to segment 166 is along a distance 161 that is a multiple of this smallest grid, which is defined as the OPC grid. For example, for 45 nm technology, the OPC grid size is 0.25 nm.

The computation of the image in a pixel based image computation is illustrated in FIG. 2A. The modified shape 160 resulting from OPC will be used to simulate the image, shown overlain on a pixel grid 200, comprising pixel elements 170. The original shape 150 is illustrated for reference. In case of pixel based simulation, the image is evaluated at the pixel grid points 171, rather than along a fragment cut-line as in the fragment-based simulation. The simulated printed image is typically represented by a contour line 180 that plots the constant image intensity that corresponds to the print threshold of the lithographic process. The values for contour 180 are computed by appropriately interpolating between the image values obtained at the pixel grid points 171.

The change of pixel size as a function of technology is illustrated in FIG. 2B. It shows that pixel size decreases as node size shrinks, but at a slower rate as node size shrinks. The size of the pixel grid is typically changed with different technology node to ensure the grid will adequately provide information about the image. For 65 nm through 22 nm, the wave length of light λ is expected to remain at 193 nm. The numerical aperture (NA) is expected to grow slowly from 0.8 to 1.45. Therefore, the pixel-grid almost remains the same compared to the change in the feature size (FIG. 2B).

Clearly from the above examples, as technology advances towards smaller features, pixel-based image computation becomes more and more efficient than fragment-based image computations. Referring to FIG. 2C, the number of points required for image computation is shown for fragment-based imaging, for cases using both tighter and more relaxed pitch, and compared to the number of points required in pixel-based imaging. As the technology continues to shrink, the number of computation points required in fragment-based image simulation increases more rapidly relative to pixel-based image simulation. For 45 nm technology and smaller pixel-based imaging computation becomes more efficient than fragment-based image computation.

A flow chart describing an OPC iteration in pixel-based imaging is shown in FIG. 3. The regularity of pixel-based imaging grid lends itself to fast Fourier transform (FFT) based computations (e.g. convolutions). FFT-based convolutions are relatively rapid compared to the classic convolution algorithms used in the earlier unevenly sampled fragment-based simulation, assuming that current practice requires calculating the partially coherent images on a uniformly sampled basis. Fast convolutions typically involve both FFT-s and inverse FFT-s, but since FFT-s and inverse FFT-s are calculated in almost exactly the same way, we will generally use the term "FFT" to refer to both.

Block 301 in FIG. 3 shows a mask layout containing geometric shapes. In Block 302 the mask layout is rasterized or divided into pixels to create a rastered or pixelized mask image as shown in Block 303. In Block 304 the rasterized mask layout is FFT-ed to create a mask image in the spatial frequency domain as shown in Block 305. In Block 306 the mask layout in frequency domain is convolved with optical and resist kernels (which amounts to point-wise multiplication) to create a convolved mask image. In Block 307 the convolved mask layout in the frequency domain is inverse-FFT-ed to create image contour (Block 308) back in the spatial domain. Finally in block 309 the mask edges in the spatial domain are moved based on the current image contour and the cycle is repeated for the next iteration of OPC. The point wise multiplication and FFT adds to the computational efficiency of the pixel-based imaging method.

Besides the computational advantages of pixel-based imaging, as described above, the pixel-based imaging is still preferable for various reasons. For example, calculation of image on a dense uniform grid enables more robust resist models in simulation, since the full exposure distribution in the neighborhood of each developed edge is available to the model as a complete and physically realistic input. Also, the regularity of pixel-based imaging is better suited to parallel computation than is non-uniform fragment-based image sampling, and this regularity provides a predictability during algorithm flow that special-purpose computer hardware can optionally exploit to improve the efficiency of CPU utilization, for example by reducing memory latency.

Although dense pixel-based image computation is computationally efficient, some of the steps described in FIG. 3 are inherently prone to a variety of errors due to numerical and discretization. This is illustrated in FIG. 4. For example, rasterization (described as 302 in FIG. 3) can result in discretization errors. The sampling to Nyquist grid (401) can have problems such as under-sampling. Both FFT (304) and Inverse FFT (307) can have problems such as numerical errors or frequency errors. Convolution (306) can also have numerical errors.

There are methods known to attempt to correct for these errors. Some of these examples are shown in FIG. 4. The discretization can be reduced by anti-aliasing. The under-sampling can be reduced by proper interpolation or careful over-sampling. The numerical errors can be reduced by high precision implementation. The frequency errors can be prevented by providing a guard-band. Some methods of compensating for such numerical or discretization errors may introduce computational inefficiencies, and it would be preferable to avoid them if possible.

Thus, there may be many variations in the implementation of pixel-based image simulations. However, in designing and calibration of the grid for a pixel-based simulation, it may be difficult to determine whether inaccuracies in a specific grid implementation are due to discretization or numerical errors or errors in the approximations used in the physical representation of the lithographic process.

In view of the foregoing, there is a need for a method to determine and minimize numerical and discretization errors in pixel-based imaging separately from other, more physically-based errors.

SUMMARY OF THE INVENTION

In accordance with the present invention, a method and computer program product and system for performing the method, are provided for the process of designing a lithographic mask that includes using pixel-based modeling of a lithographic process, for example, in optical proximity correction or mask verification procedures. The selection of the appropriate lithographic process model using a pixel-based simulation of the mask images includes the selection of an appropriate pixel grid size, and it is an objective of the present invention to identify when such a grid size meets criteria that minimizes numerical and/or discretization errors.

According to one aspect of the invention, a method of designing a mask is provided including using pixel-based model for simulating a lithographic process, the method comprising the steps of providing a minimum step size for modifying mask shapes (e.g. the OPC grid size), selecting a pixel grid size larger than the minimum step size, providing a test pattern comprising a plurality of rows of features, wherein each row of features is separated from an adjacent row of features along a y-direction orthogonal to said x-direction by a y-separation greater than or equal to a region of influence, and wherein each row of the plurality of rows comprises the same sequence of a plurality of features, and wherein a starting location of each row is offset along the x-direction from the starting location of each of the other rows of the plurality of rows by an x-separation that is different for each pair of rows and the x-separation ranges from the minimum step size to at least the pixel grid size by an integer multiple of the minimum step size, determining images of the test pattern using said pixel grid size, determining a metric of a comparison between the image of said reference row with the image of each other row in the test pattern, and determining whether the metric violates a predetermined criterion.

According to another aspect of the invention, if the metric violates the predetermined criterion, then modifying the pixel grid size and repeating the steps of designing a test pattern using the modified pixel grid size, determining images of the test pattern, determining the metric, and comparing the metric to the predetermined criterion until the metric meets the predetermined criterion.

According to yet another aspect of the invention, a mask design process includes simulating mask images with a pixel-based model using the last modified pixel grid size in which the metric meets the predetermined criterion.

In another aspect of the invention, a computer readable storage medium or a computer system is provided having stored therein computer readable instructions which when executed by a computer cause the computer to perform method steps.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 6B illustrates two rows of features of a test structure in an embodiment in accordance with the invention.

FIG. 8A illustrates an embodiment of a test structure overlain with corresponding images of the test structure in accordance with the invention.

DESCRIPTION OF THE PREFERRED EMBODIMENTS

In accordance with the present invention, test structures are designed to characterize numerical and/or discretization errors in pixel-based process models used in designing lithographic masks. In a pixel-based process model, the pixel grid is typically designed to be uniform along a particular direction. The spacing in the x direction may be different than in the orthogonal y direction, but will be uniform along a given direction.

The selection of the size of the pixel grid elements is based on the effective resolution of the lithographic process, which is related to the Raleigh limit which is given by $\lambda/(4NA)$, where $\lambda$ is the wavelength of the illumination energy, NA is the numerical aperture. The pixel grid is given by $\alpha=\lambda/(k4NA)$ where k is a scaling or oversampling factor. For 45 nm technology, $\lambda=193$ nm. The numerical aperture of the optical system is typically about 1.2, but may range from about 0.45 to 1.3. The scaling or oversampling factor k is related to the development process, for example, the resist or etch processes. For a purely optical process, k=1. For chemically amplified resists, k is typically between about 1.5 to 2. The value of k is positive may be selected based on a speed-accuracy tradeoff. Large values of k can increase the accuracy of interpolation of the image values between computed pixel grid points but significantly add to the cost of computation. A pixel grid with k=1 represents the smallest unit at which the lithographic process can respond to a change in design information. Thus, for the case of 45 nm technology, using λ=193 nm, k=2, and NA=1.2, the size of a pixel grid element a may be chosen to be about 20 nm.

Figure 1B:
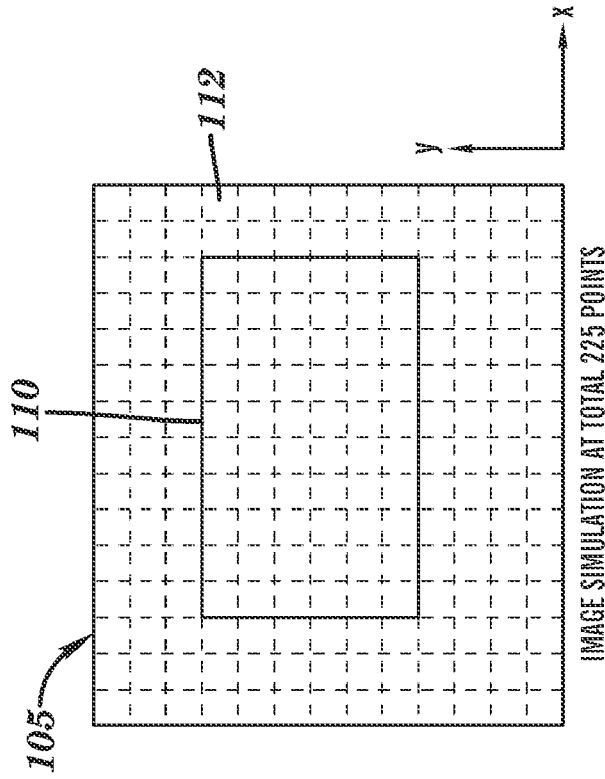
FIGS. 1A-1D illustrate computational grids used for image simulation during a mask design process.
Figure 1A:
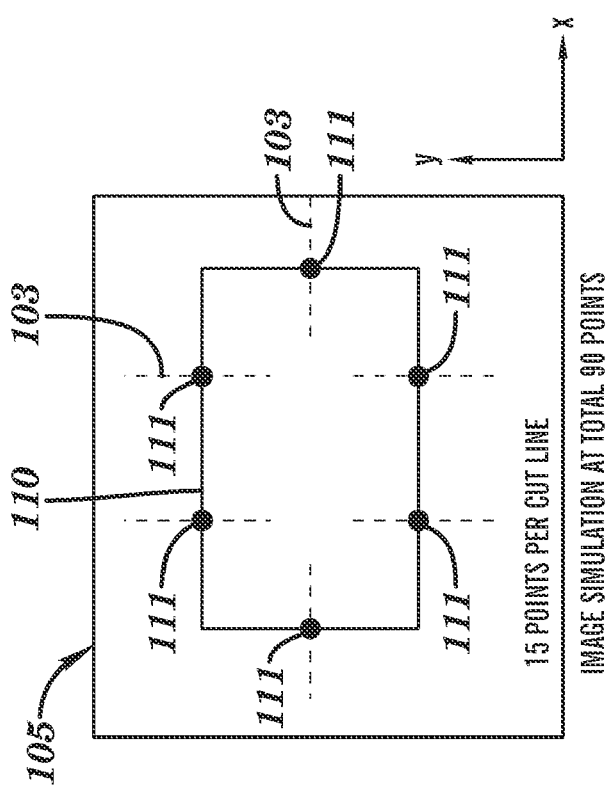
Figure 1D:
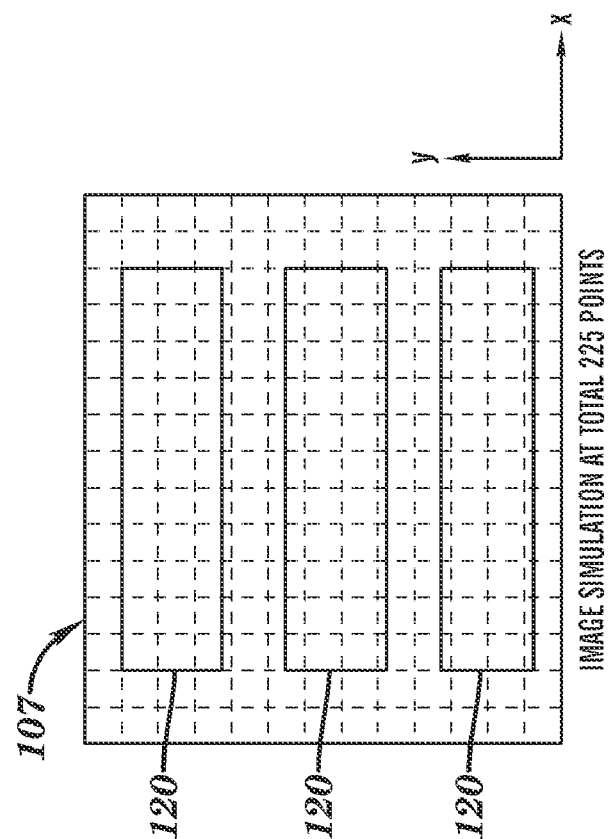
Figure 1C:
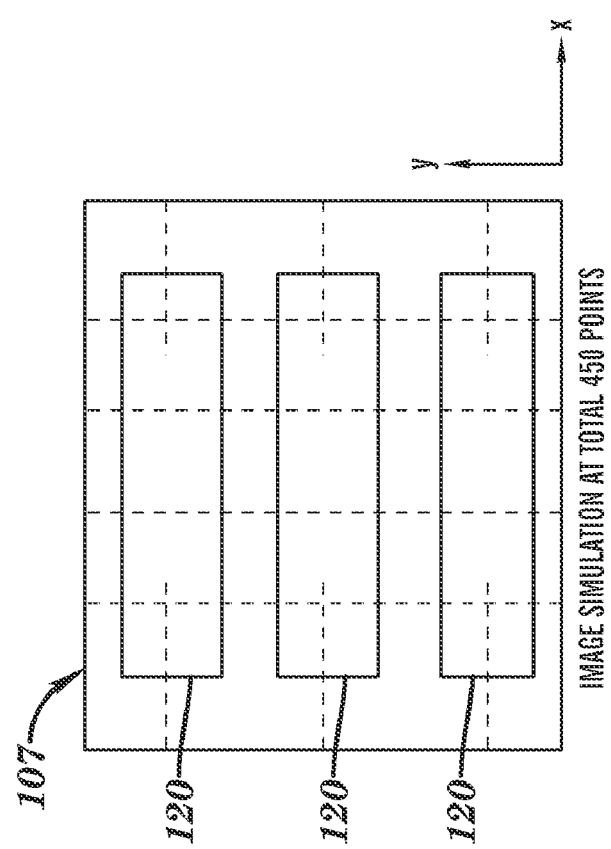
Figure 1E:
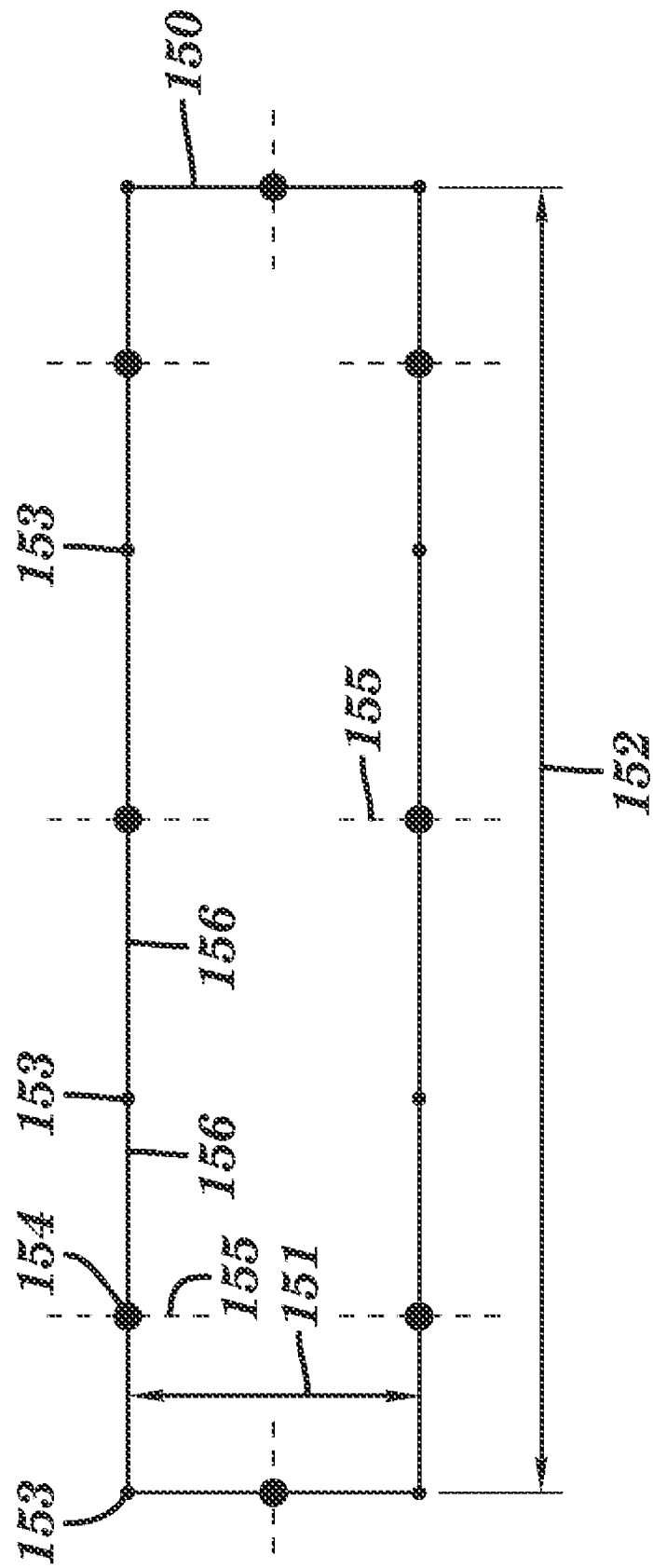
FIG. 1E illustrates an initial mask shape having edge fragments and corresponding image evaluation sites.
Figure 1F:
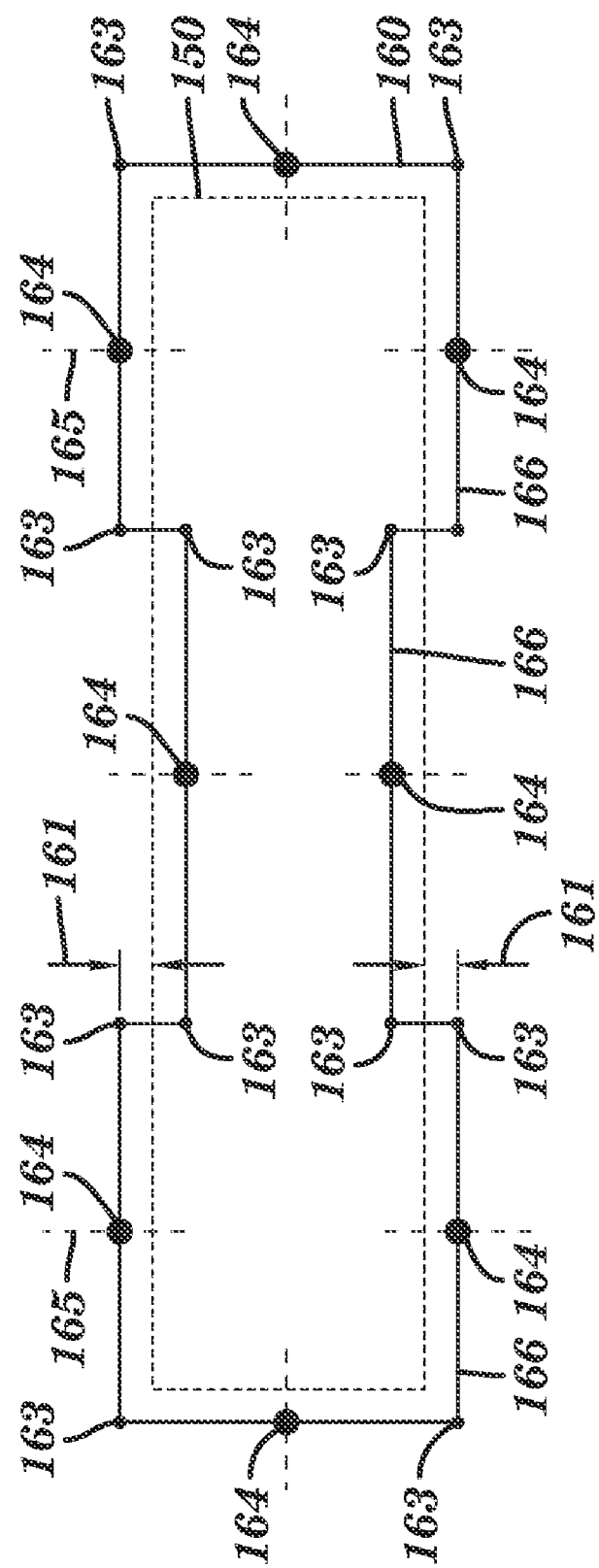
FIG. 1F illustrates a modified version of the mask shape from FIG. 1E in which edge fragments have been adjusted along a minimum step size grid.
Figure 2A:
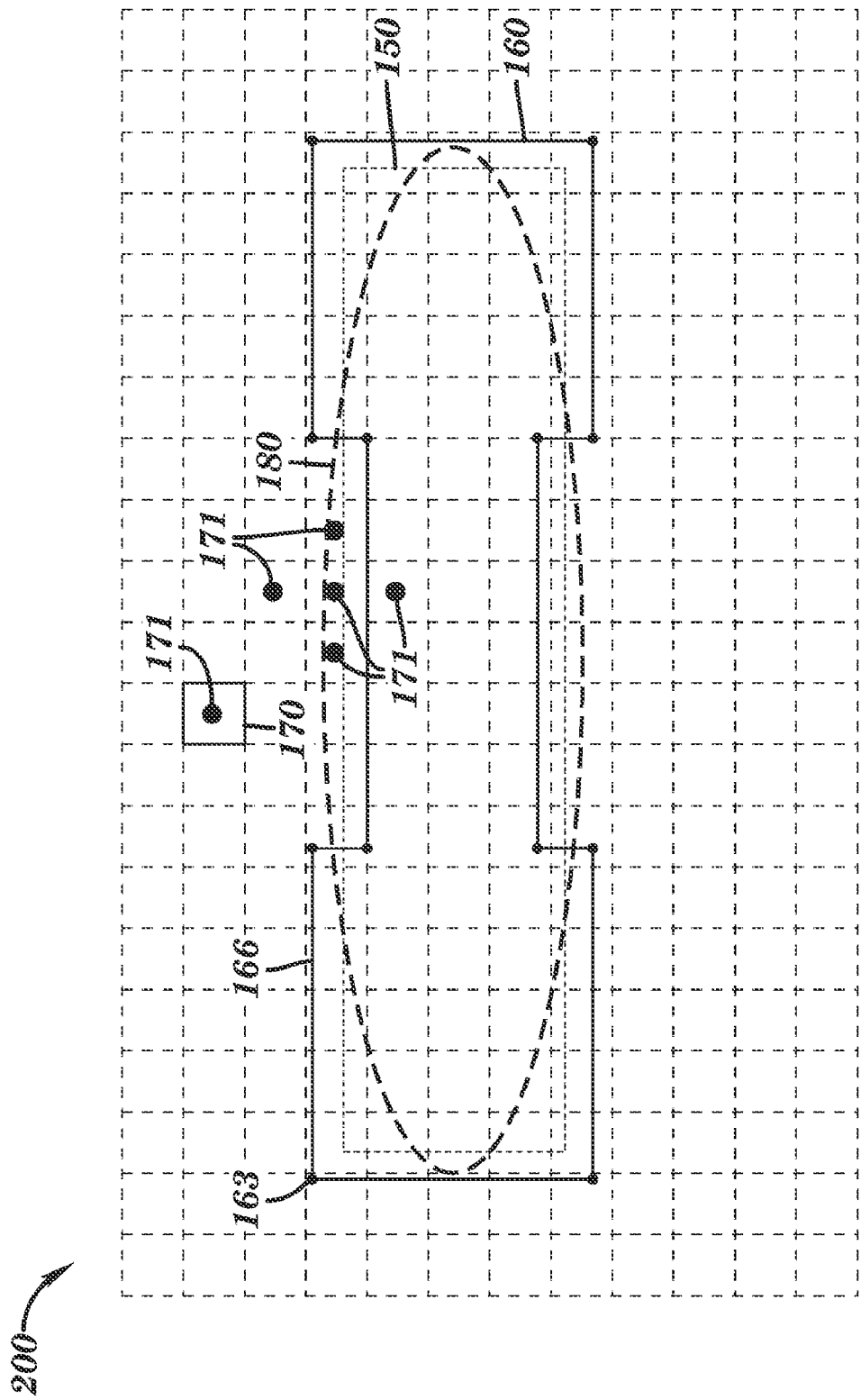
FIG. 2A illustrates the mask shape from FIG. 1F as laid out on a pixel grid for image simulation, with a contour corresponding to a simulated image for the mask shape.
Figure 2B:
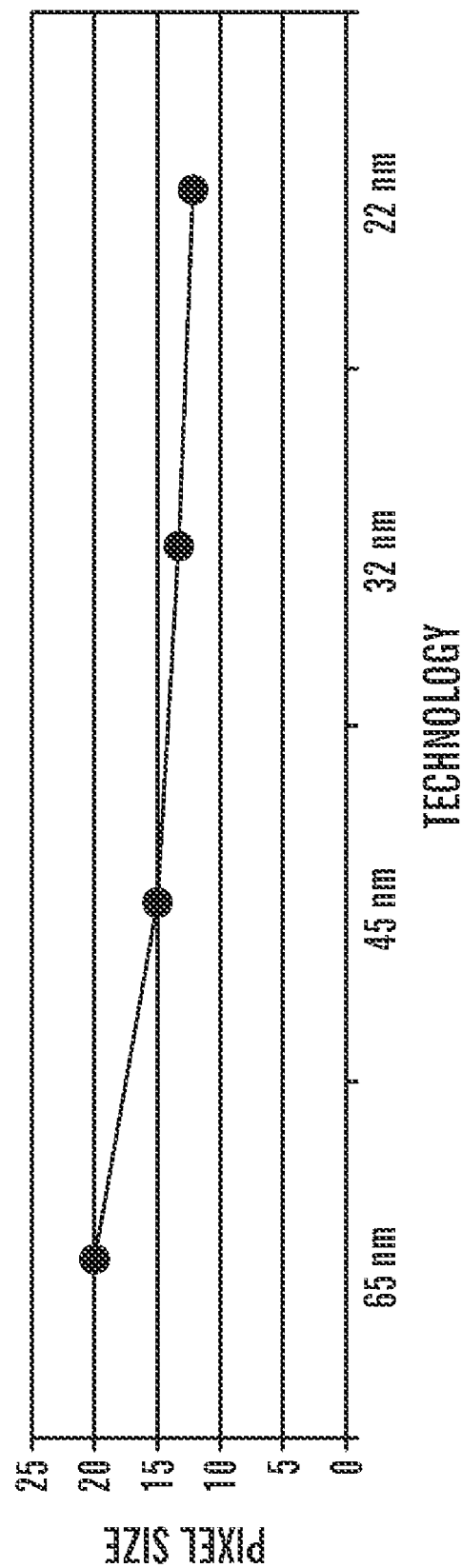
FIG. 2B is a plot illustrating a pixel grid size requirement as a function of technology.
Figure 2C:
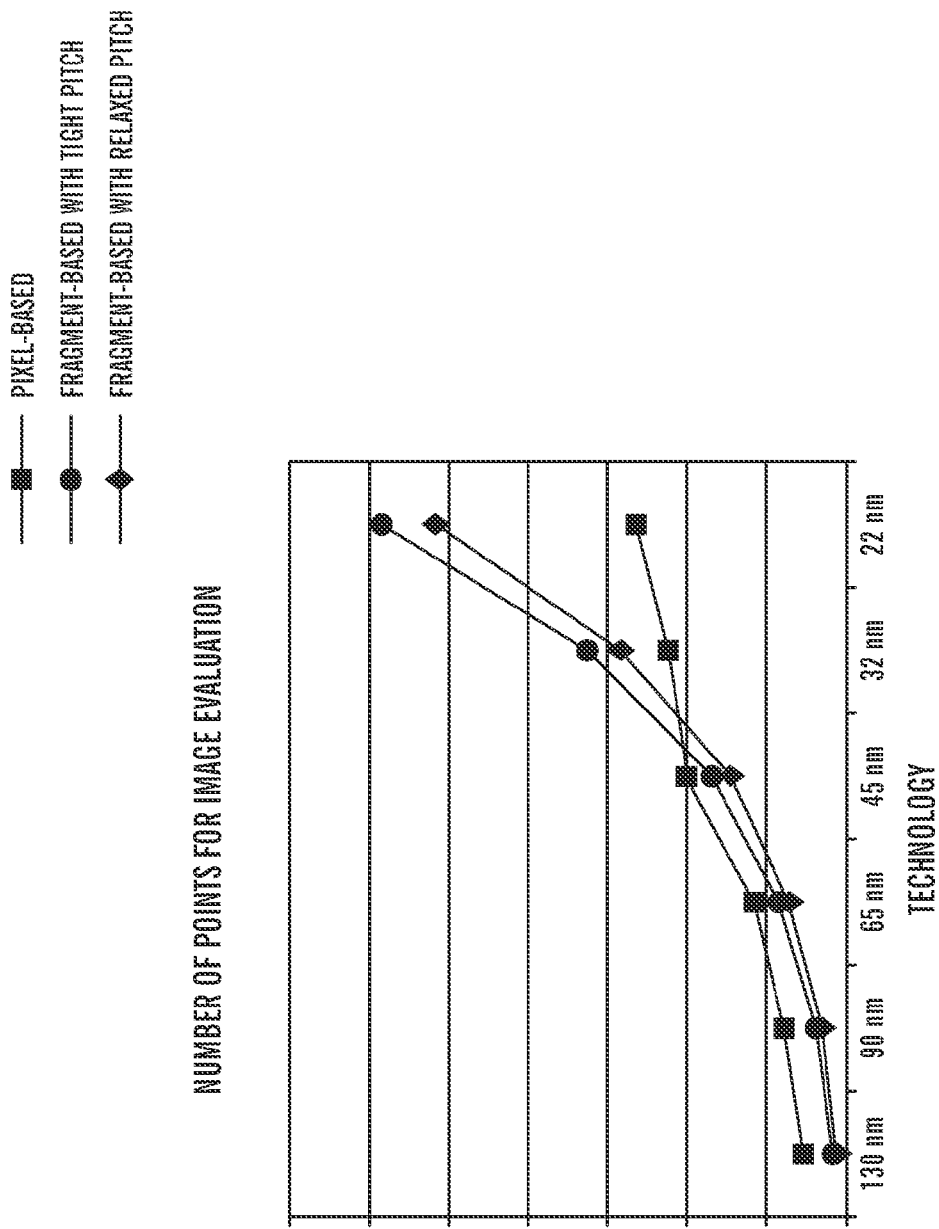
FIG. 2C is a plot illustrating the number of image computation points required as a function of technology for fragment-based imaging and pixel-based imaging.
Figure 3:
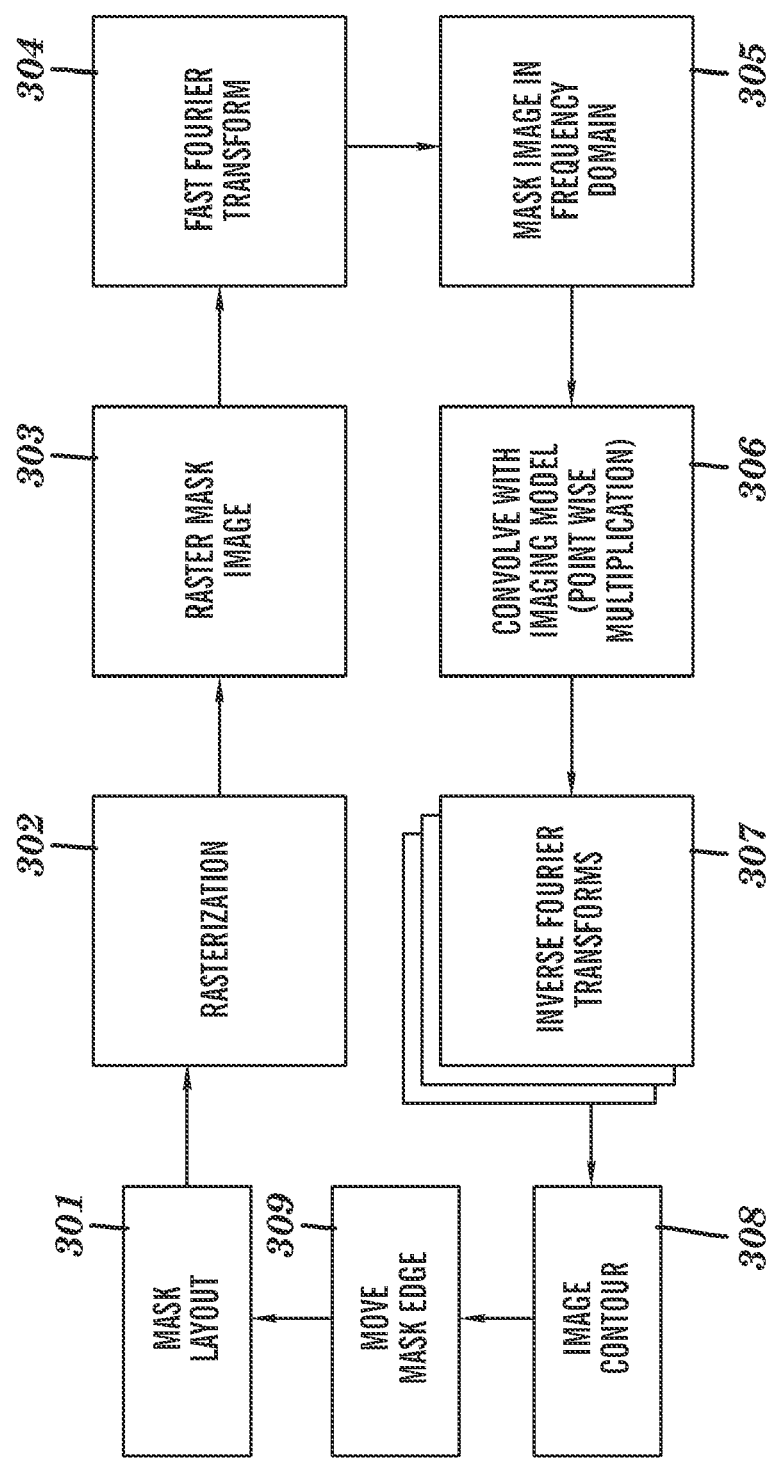
FIG. 3 illustrates a flow chart of an optical proximity correction iteration using a pixel-based imaging methodology.
Figure 4:
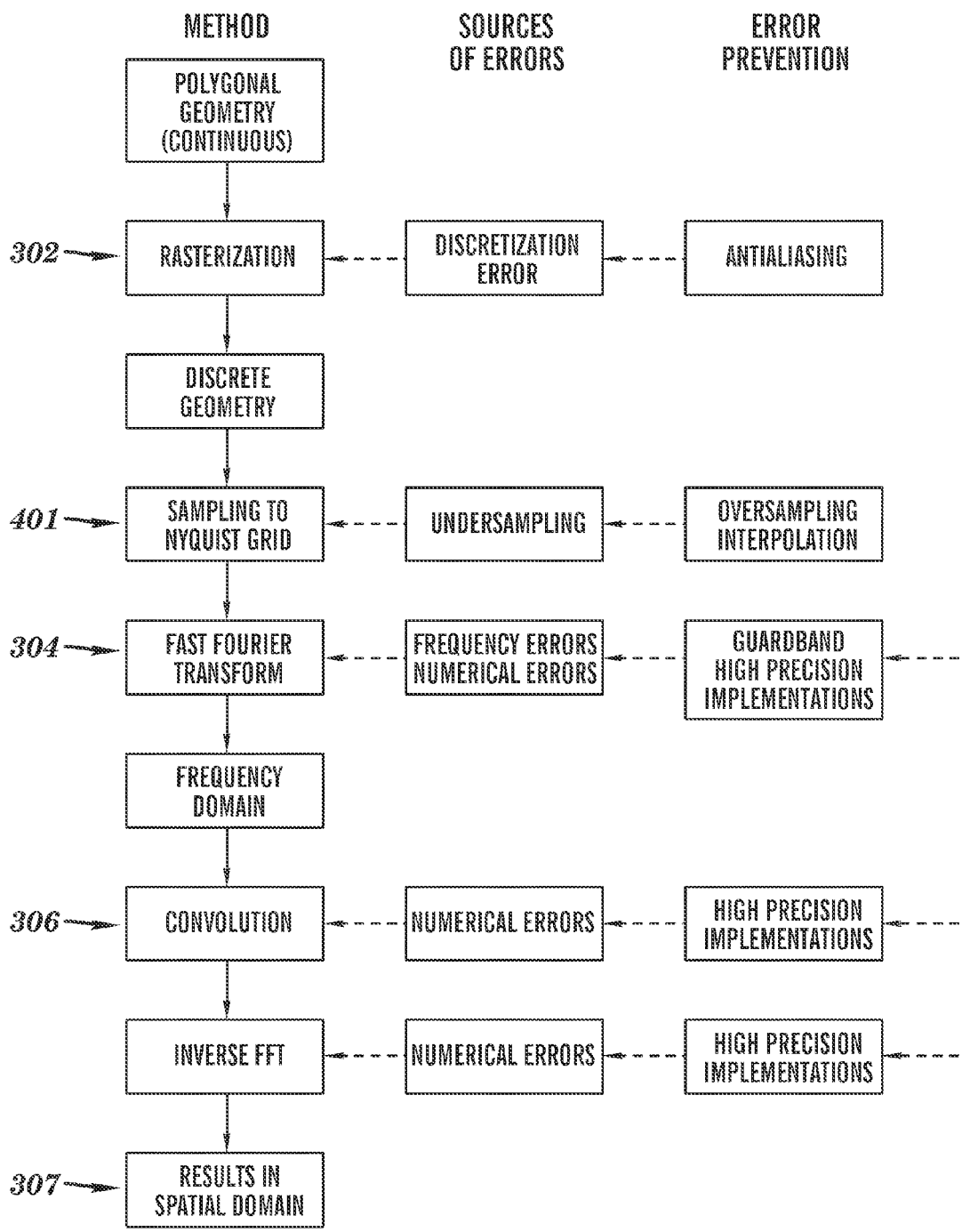
FIG. 4 illustrates sources of discretization and numerical errors in a pixel-based imaging methodology.
Figure 5:
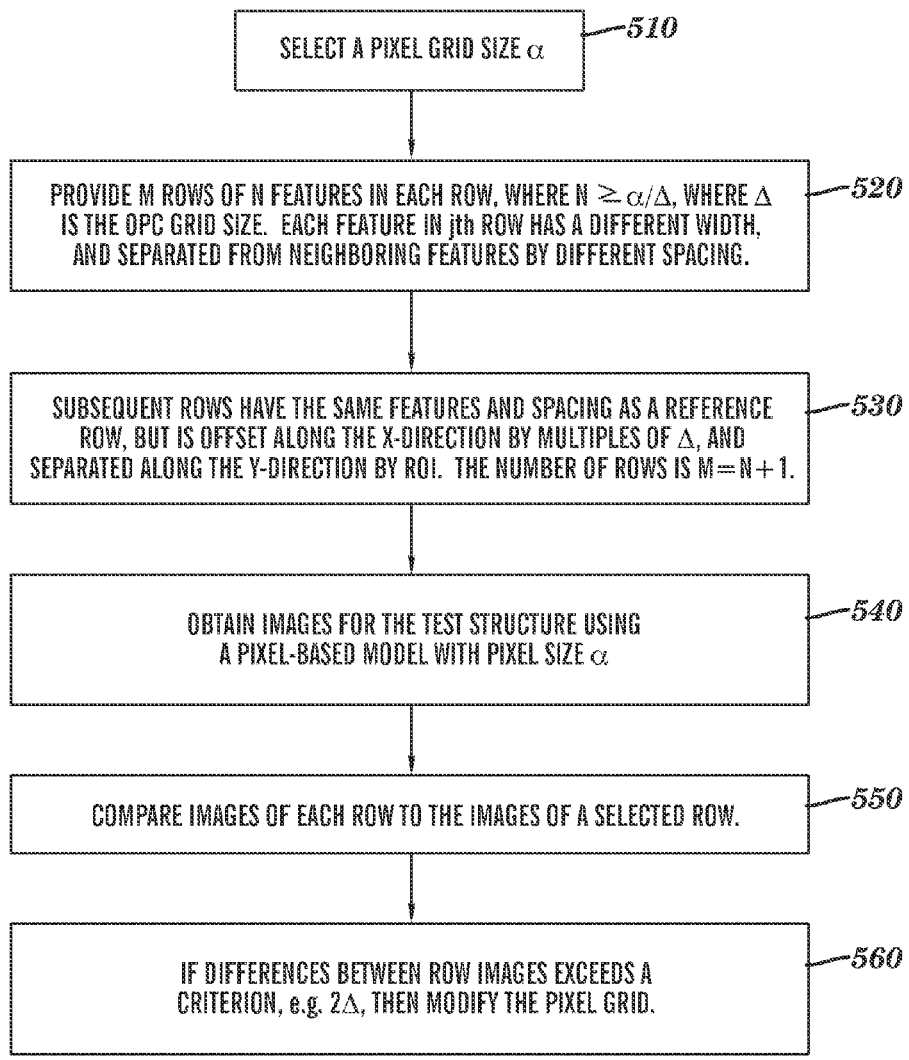
FIG. 5 illustrates an embodiment of the method in accordance with the invention.

FIG. 5 illustrates a preferred embodiment of a method of characterizing the numerical errors in a pixel-based imaging calculation, in accordance with the invention. A test structure is provided that includes a plurality of rows, each row having N shapes, where N is selected based on the size of the pixel grid being evaluated. In accordance with the invention, a pixel grid size is selected for evaluation (Block 510). This selection may be based on selecting the scaling factor k if the pixel grid is chosen as a function of the Rayleigh limit, but the selection of pixel grid size is not so limited.

Next, a number of rows M in a test structure are designed so that each row is characterized by a plurality of features arranged along an x-direction (Block 520). The sequence of features in each row are the same, but each row is offset from every other row along the x-direction by integer multiples of the minimum step size λ for modifying the mask, e.g. the OPC grid size Δ. The offset of the starting position of each row varies relative to a reference row starting position by a multiple of the OPC grid size Δ. Each starting offset value is preferably different, and should range from the minimum step size Δ to at least the size of the pixel grid size α. Each row is spaced from each other by a distance that is greater than or equal to the region of influence (ROI) for the lithographic process (Block 530).

In a preferred embodiment, the number of features N in a row is chosen to be at least the ratio of pixel grid size α to minimum step size Δ (Block 520). Each feature in a row has different width that preferably ranges from a minimum feature size (CD) to the minimum feature size plus the pixel size (CD+α) in increments of the minimum step size Δ. In addition, each feature in a row is preferably spaced along the x-direction from other adjacent features in a row by a spacing that different from other spacings, and the spacings preferably range from a minimum space size σ for the lithographic process to the minimum space size plus the pixel size (σ+α). (Block 520) It should be noted that the features in a row may be individual shapes, or may be connected features having appropriate widths and spacings that provide information about the range of span of OPC grid size to pixel grid size.

The number of rows M and the number of shapes in a row N are preferably based on the ratio of pixel grid size α to minimum step size Δ. For example, given a selected pixel grid size α, the number of rows M and number of shapes N in a row of the test structure is equal to or greater than α/Δ, where Δ is the size of the OPC grid. Alternatively, since the pixel grid size α may be chosen in relation to the Rayleigh limit with a given scaling factor k (as discussed above), M and/or N may be chosen to be equal to or greater than $$\frac{\lambda}{k\Delta 4NA}.$$

The number of rows M and number of shapes N in a row of the test structure is thus preferably chosen to enable evaluation of the effectiveness of a particular pixel grid size, or scaling factor k.

The images for the test structure are then simulated using the selected pixel grid size α (Block 540). The lithographic process model used may be the model used during the OPC or mask verification portion of the design process, or may be an appropriate approximation to the lithographic process, such as a computationally faster model of the lithographic process.

The resulting images for each jth feature in a given row are compared to the corresponding image of the jth feature in a reference row of the test structure (550). The selected reference row may be selected from any of the rows in the test structure. Any suitable metric that characterizes differences in the images may be used. For example, a difference in expected edge location, or edge placement error (EPE) may be one suitable metric. In another example, a threshold image intensity may be used, but the invention is not so limited to a specific metric. If the metric violates or exceeds a predetermined criterion, then the pixel-grid may be deemed to have unsuitably large numerical and/or discretization errors, and a corrective action may be taken, for example, a modification of the pixel grid size (Block 560). For example, in a typical application, if the EPE for any pairs of corresponding jth feature images exceed about 2Δ, then that pixel grid would be deemed to have unacceptably large discretization/numerical errors, and an adjustment in pixel grid size would be required.

Figure 6A:
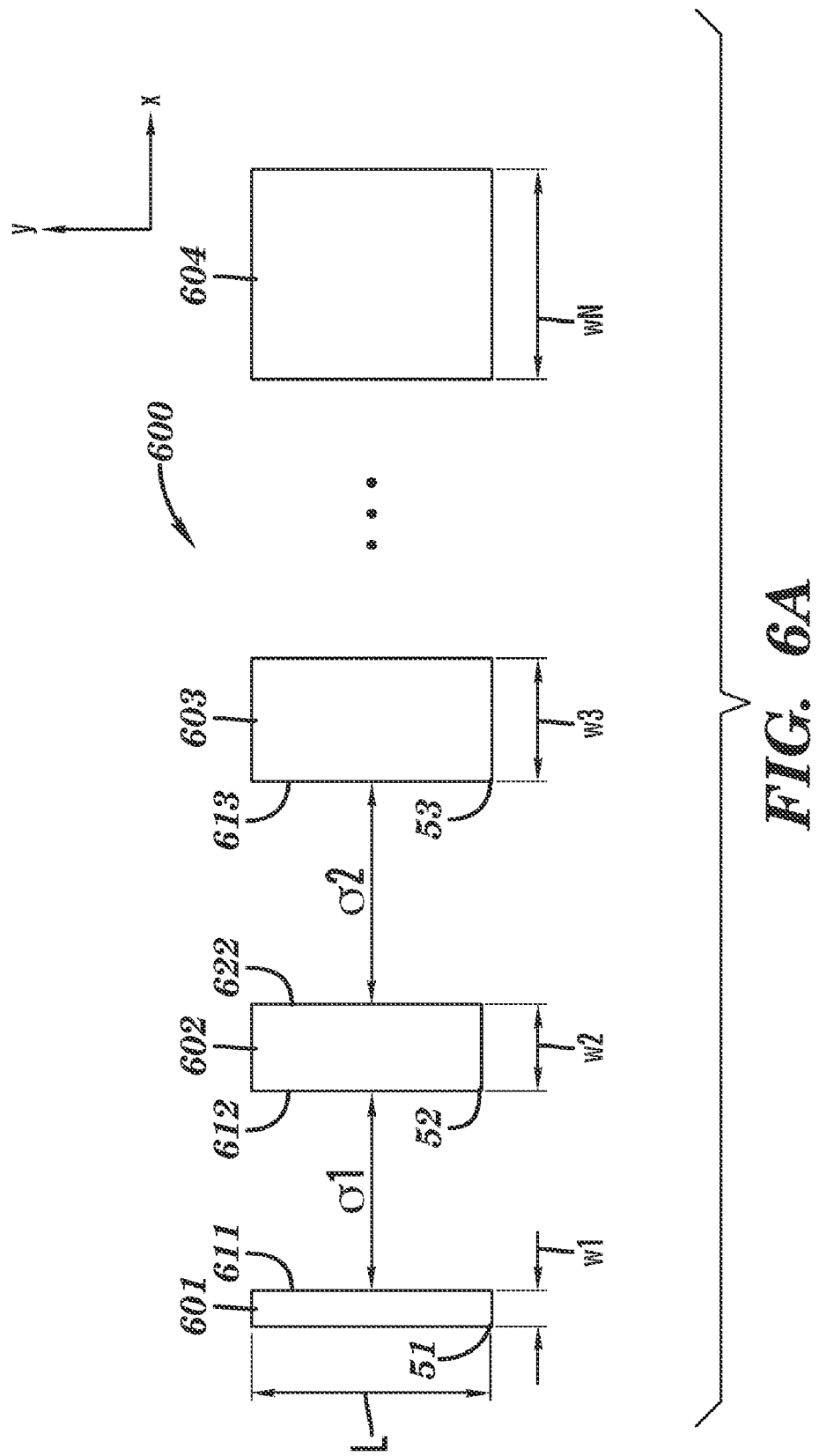
FIG. 6A illustrates a first row of features of a test structure in one embodiment in accordance with the invention.

In a preferred embodiment of test structures designed according to the invention, a plurality of ordered sequences or rows of two-dimensional shapes is arranged on a plane. FIG. 6 illustrates a preferred embodiment of a first row 600 of shapes of the test structure, the row arranged along an x-direction, as shown. The first shape 601 in the first row 600 has a width $w_1$ equal to the minimum width CD that is desired to be printed on the wafer. CD is the minimum width that is desired to be printed on the wafer, which may include, but is not limited to, fractures such as design, lithographic resolution, manufacturability, or other considerations. All shapes in the row will have the same length L that is chosen so that the length to width aspect ratio is large enough to be resolvable by an optical mask inspection tool. The length to width aspect ratio is preferably greater than 4:1, and is typically in the range about 4-5. However, in accordance with the invention, the widths of the shapes in the row vary incrementally along the direction of the row, e.g. the x-direction as illustrated in FIG. 6A.

The second shape 602 in the first row 600 has a width w2 that is equal to the CD plus an incremental amount Δ equal to the width (along the x-direction) of the OPC grid element size. The OPC grid element width Δ is the smallest line segment, according to mask manufacturability requirements, that is used to fragment and modify shape edges during the OPC process. The resolution of the OPC grid depends on the capabilities of the mask inspection tool and mask manufacturing tool. The mask shapes will be aligned to the OPC grid. For 45 nm technology, the OPC grid size is typically 0.25 nm, resulting in about 180 OPC grid elements per CD. The edge 612 of the second shape 602 is spaced a distance σ from the nearest adjacent edge 611 of the first shape 601. The space σ between the first shape 601 and second shape 602 is preferably the minimum lithographically resolvable space between two shapes. For example, a typical value of σ is about 2 to 3 times CD.

The third shape 603 has a width $w_3$ that is equal to CD plus two times Δ, and is located so that its left edge 613 is spaced a distance σ+Δ from the nearest edge 622 of the second shape 602.

Stated another way, if the lower left corner 51 of the first shape 601, having width $w_1$, is located at the coordinate $(x_1, y_1)$, then the lower left corner 52 of the second shape 602, having width $w_2=w_1+\Delta$, is located at coordinate $(x_2,y_2)=(x_1+w_1+\sigma,y_1)$, where $x_2=x_1+w_1+\sigma$ and $y_2=y_1$. Similarly, the third shape 603, having width $w_3=w_1+2\Delta$, has a lower left corner 53 located at coordinate $(x_3,y_3)=(x_2+w_2+\sigma+\Delta,y1)$.

In the same manner the lower left corner of the i-th element can be identified by the equation: $(x_i,y_i)$, where, $x_i$ is defined as: $x_i = x_1 + (w_1 + \sigma) + (w_1 + \Delta + \sigma + \Delta) + (w_1 + 2\Delta + \sigma + 2\Delta) + (w_1 + 3\Delta + \sigma + 3\Delta) + \ldots + (w_1 + (i-1)\Delta + \sigma + (i-1)\Delta) = x_1 + (i-1)(w_1 + \sigma) + 2(i-1)(i-2)\Delta/2 = x_1 + (i-1)((w_1 + \sigma) + (i-2)\Delta)$; and $y_i = y_1$.

The other three corners of the rectangles are defined likewise. The lower right corner is given as $(x^{lr}_i, y^{lr}_i) = (x_i + w_1 + i\Delta, y_i)$; the upper right corner is given as $(x^{ur}_i, y^{ur}_i) = (x_i + w_1 + i\Delta, y_i + L)$; and finally the upper left corner is defined as $(x^{ul}_i, y^{ul}_i) = (x_i, y_i + L)$.

Since the size of the OPC grid element is much smaller than the typical size of a pixel grid element, the total number of shapes N in the row is preferably chosen so that the difference in width of the Nth shape and the width of the first shape is at least the width of one pixel grid element, where each shape in the row has a different width in increments of the OPC grid size. Since the size of the pixel grid element may not be known, a priori, preferably, the range of shape widths spans the Rayleigh limit, that is, N is preferably chosen to be equal to λ/(4NA) divided by the size of the OPC grid Δ. Such a choice would allow calibration of the pixel-based model for an optimal value of k. Alternatively, if k is known, then N may be selected to be $$N = \left(\frac{\alpha}{\Delta}\right)\eta,$$

where α is the size of pixel grid element, Δ is the size of an OPC grid element, and η is an integer, preferably in the range 1 to 4, and more preferably η=4.

In accordance with the invention, each sequential shape in the row is separated from the prior adjacent shape in the row by a distance that starts at the minimum space σ and incrementally increases by the size of the OPC grid element A until the Nth shape is placed in the row.

In accordance with the invention, at least two rows of shapes are provided in the test pattern, and preferably N rows are provided. Each subsequent row has the same number and sizes of shapes as the first row, wherein each of the shapes preferably are arranged in the same sequence, have the same sizes and spacings as those in the first row. However, referring to FIG. 6B, each next row is arranged to be offset from the prior row by an incremental distance 629 equal to the OPC grid size λ along the x-direction. In addition, each row is preferably separated from other rows by a distance 625 that is at least the region of influence or interaction (ROI). The ROI is typically defined as the maximum radius of optical influence among all the optical kernels and other image traits used in the lithographic process models, such as optical and resist models, so as to ensure that the simulation of images takes into account the influence of features that are significant, according to one or more predetermined criteria, and the effect of features located beyond the ROI on the image at a given point are deemed to be insignificant.

With respect to the lowest left corner of the first shape $(x_1, y_1)$, The lowest left corner of the shape at the j-th row and i-th column is given as: $(x_{ij}, y_{ij})$, where $x_{ij} = x_1 + (i-1)((w_1 + \sigma) + (i-2)\Delta) + (j-1)\Delta$; and $y_{ij} = y_1 + (j-1)(R+L)$, where R is at least ROI and L is the minimum length as defined earlier.

The other three corners of the rectangle at the j-th row and i-th column is given in a similar manner. The lower right corner is given as $(x^{lr}_{ij}, y^{lr}_{ij}) = (x_{ij} + w_1 + i\Delta, y_{ij})$; the upper right corner is given as $(x^{ur}_{ij}, y^{ur}_{ij}) = (x_{ij} + w_1 + i\Delta, y_{ij} + L)$; and finally the upper left corner is defined as $(x^{ul}_{ij}, y^{ul}_{ij}) = (x_{ij}, y_{ij} + L)$.

Figure 7:
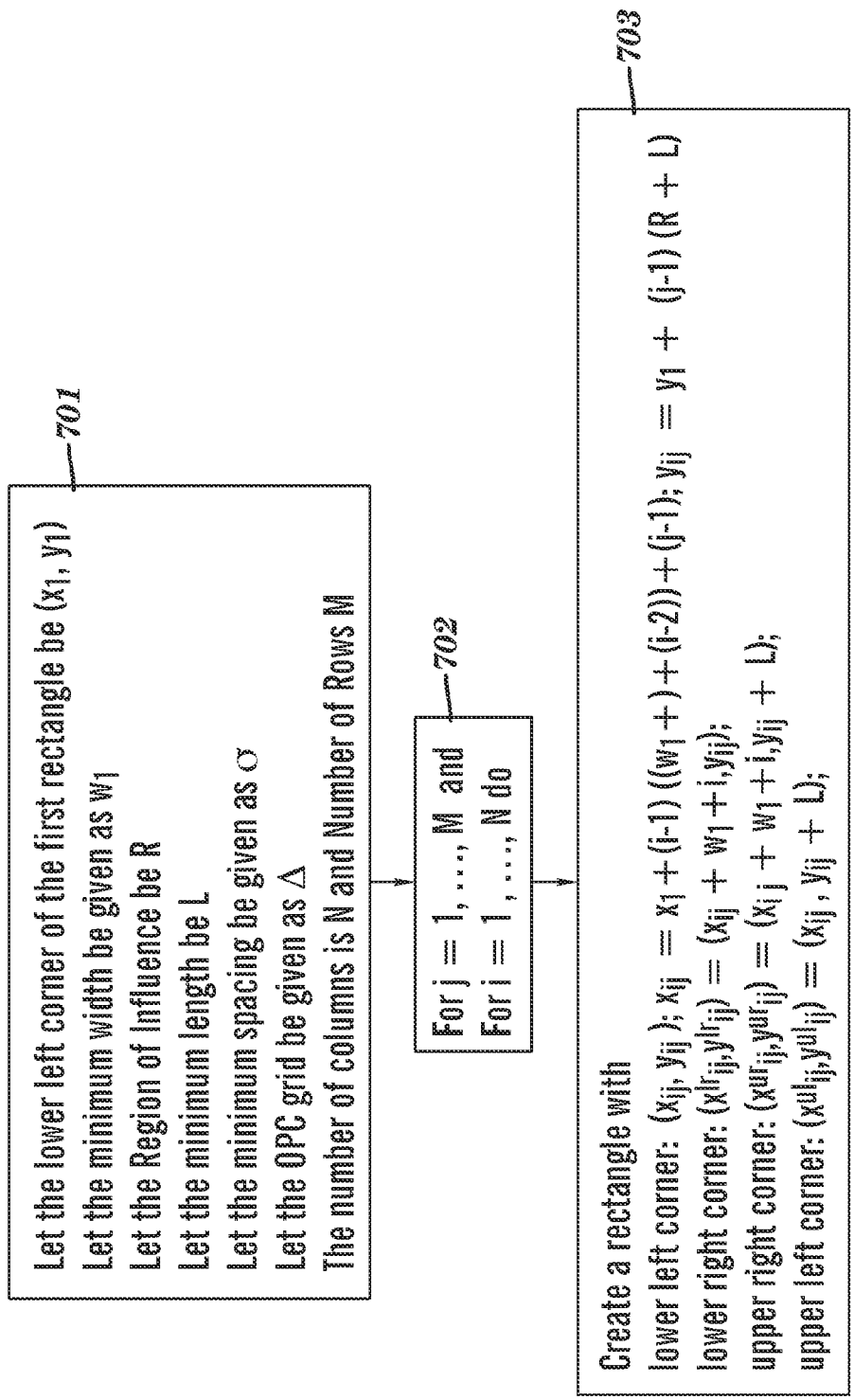
FIG. 7 illustrates one embodiment for designing a test structure in accordance with the invention.

The above procedure is illustrated in FIG. 7. Block 701 in FIG. 7 shows the inputs to the procedure. The inputs are the lower left corner of the first rectangle be $(x_1, y_1)$, the minimum width is given as $w_1$, the Region of Influence (ROI) is R, the minimum length is L, the minimum spacing is given as σ, the OPC grid be given as Δ, number of columns is N and number of rows M.

In Block 702 of FIG. 7 the block 703 is iterated for M number of rows and N number of columns. In block 703 of FIG. 7 a rectangle at the i-th column at the j-th row is positioned with the lower left corner: $(x_{ij}, y_{ij})$; $x_{ij} = x_1 + (i-1)((w_1 +) + (i-2)) + (j-1)$; $y_{ij} = y_1 + (j-1)(R+L)$; lower right corner: $(x^{lr}_{ij}, y^{lr}_{ij}) = (x_{ij} + w_1 + i, y_{ij})$; upper right corner: $(x^{ur}_{ij}, y^{ur}_{ij}) = (x_{ij} + w_1 + i, y_{ij} + L)$; and the upper left corner: $(x^{ul}_{ij}, y^{ul}_{ij}) = (x_{ij}, y_{ij} + L)$.

In the above embodiment and the example, we have discussed only a vertical rectangle which is incremented in the x-direction. However, it can be assumed that those who are ordinarily skilled in the art can also create patterns by other variations such as working with a gap, or vertically oriented shapes or incrementing in the y-direction or any combination thereof.

FIG. 5 illustrates a preferred embodiment of a method of characterizing the numerical errors in a pixel-based imaging calculation, in accordance with the invention. Since the distance between the rows are greater than ROI, they are independent of one another from a perspective of the lithographic process. Therefore any differences on the contours between two rows are caused by the shift in the pattern. These differences can be attributed to the shift of the shapes which would indicate some potential problems in the implementation of the pixel-based imaging grid.

In accordance to the present invention the pixel grid α is provided in as the input as illustrated in Block 510 in FIG. 5. A test pattern consisting of M rows of N shapes in each row, where N≧α/Δ, where Δ is the OPC grid size. Each shape in jth row has a different width, and separated from neighboring shapes by different spacing. This is illustrated as Block 520 in FIG. 5. Subsequent rows have the same shapes and spacing as the first row, but is offset along the x-direction by increments of Δ, and separated along the y-direction by ROI. The number of rows is M=N+1. This is illustrated as Block 530 in FIG. 5. Detailed descriptions of creating these shapes are illustrated as Blocks 701, 702 and 703 of FIG. 7.

Once the test structures are created in accordance to Block 520 and 530 of FIG. 5, they are simulated using the lithographic process model and the given pixel grid of size α to create image contours, which is illustrated as Block 540 in FIG. 5. FIG. 8A illustrates an example of rows 881, 882, 883 in an embodiment of a portion of a test structure overlain with image contours as embodied in Block 540 in FIG. 5. Corresponding test features 801, 803, 805 are illustrated overlain with corresponding simulated images 802, 804, 806, respectively.

Figure 8B:
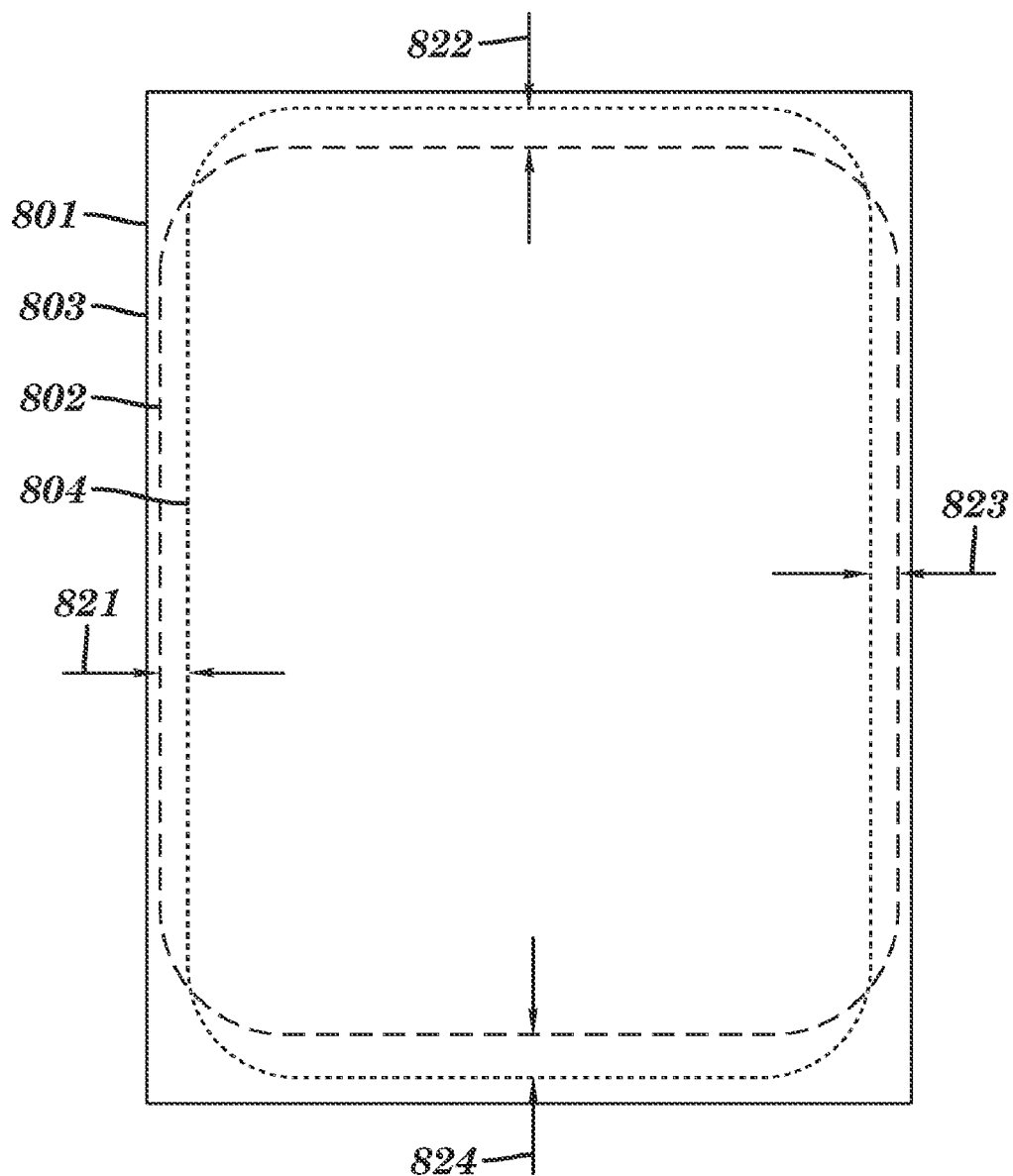
FIG. 8B illustrates a comparison between an image of one shape in a row to the image of the corresponding shape in another row of the test structure in accordance with the invention.

In accordance to the current invention the next step is illustrated in Block 550 in FIG. 5, wherein the image contours of the corresponding shapes from different rows are compared with each other. This is illustrated in FIG. 8B, in which the corresponding jth shapes 801 and 803 are overlain on each other along with their corresponding expected image contour locations 802 and 804 with respect to the shape boundaries 801,803, respectively. The differences between expected image edge locations 802 and 804 at different predefined locations are shown as 821, 822, 823, 824 in FIG. 8B respectively.

In accordance to the current invention the next step is illustrated in Block 560 in FIG. 5, wherein the differences or metric are compared against a predetermined criterion, or tolerance. For example, edge placement error metrics (EPE) are shown as 821, 822, 823, 824 in FIG. 8B. If the EPEs are greater than the given tolerance, e.g. 2-3Δ then, in accordance with an embodiment according to the current invention, the method either flags an error or modifies the pixel grid α.

Figure 9:
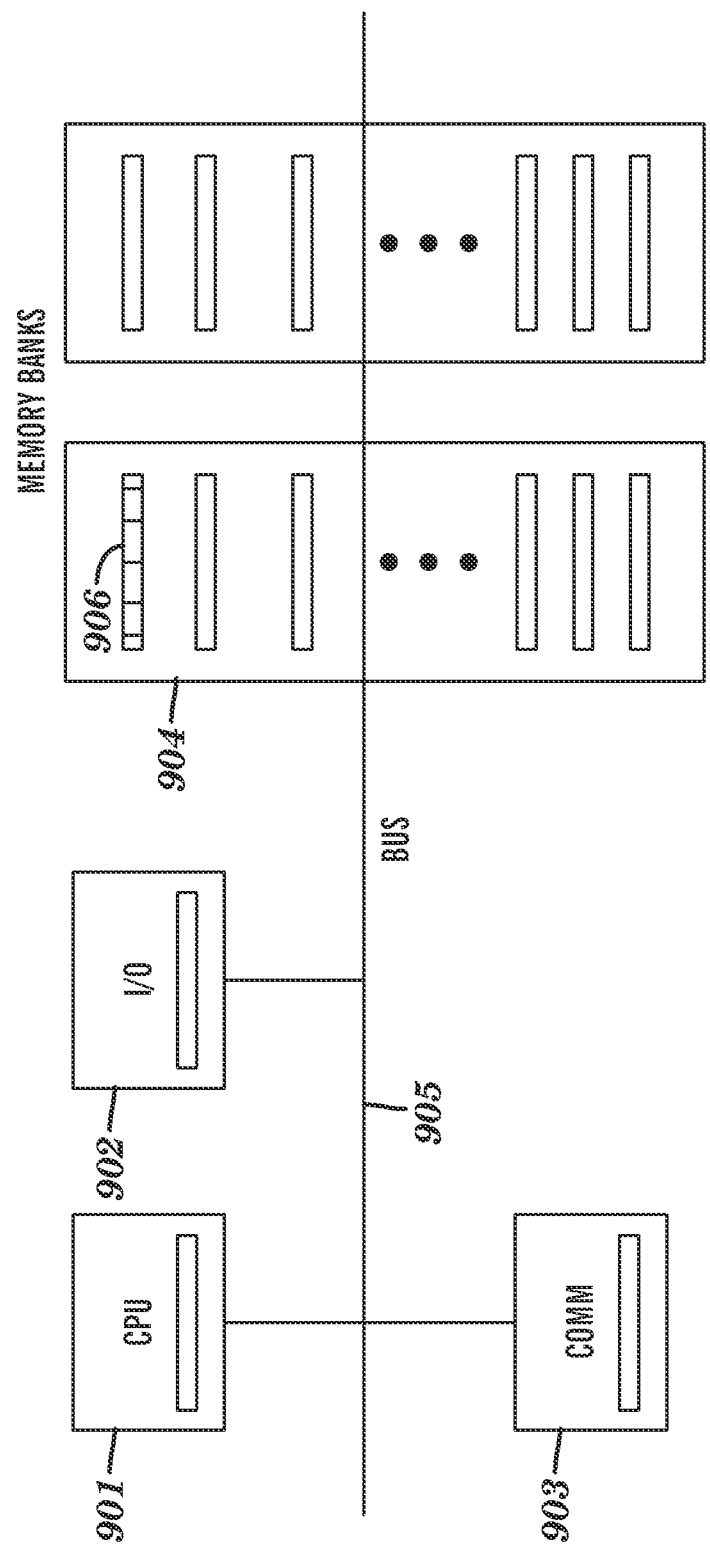
FIG. 9 illustrates an embodiment of a computer program product and computer system for performing the method in accordance with the invention.

The present invention is ultimately to be implemented in a digital computer, as shown on FIG. 9, which main components are: a central processing unit (CPU) 901, at least one input/output (I/O) device 902 (such as a keyboard, a mouse, a compact disk (CD) drive, and the like), a controller 903, a display device 908, a storage device 909 capable of reading and/or writing computer readable code, and a memory 906—all of which are connected, e.g., by a bus or a communications network (905). The present invention can be implemented as a computer program product stored on a computer readable medium 907, such as a tape or CD. The computer program product contains instructions to implement the method according to the present invention on a digital computer, as shown in FIG. 9. Finally, the present invention can also be implemented in a plurality of such a digital computer where the present items may reside in close physical proximity or distributed over a large geographic region and connected by a communications network.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

The invention claimed is:

1. A method of designing a mask including using pixel-based model for simulating a lithographic process, the method comprising the steps of:
providing a minimum step size for modifying mask shapes;
selecting a pixel grid size larger than said minimum step size;
providing a test pattern comprising a plurality of rows of features,
wherein each row of features is separated from an adjacent row of features along a y-direction orthogonal to an x-direction by a y-separation greater than or equal to a region of influence,
and wherein each row of said plurality of rows comprises the same sequence of a plurality of features, wherein said features each have a feature width along said x-direction, and each of said feature widths within each row differ from every other feature width within said row by a multiple of said minimum step size,
and wherein a starting location of each row is offset along the x-direction from the starting location of each of other rows of said plurality of rows by an x-separation that is different for each pair of rows and said x-separation ranges from said minimum step size to at least said pixel grid size by an integer multiple of said minimum step size;
determining, by a processor, images of said test pattern using said pixel grid size;
determining a numerical error metric of a comparison between said image of a reference row with said image of each other row in said test pattern; and
designing said mask using said pixel grid size if said numerical error metric meets a predetermined criterion.

2. The method according to claim 1, further comprising if said numerical error metric does not meet said predetermined criterion, then modifying said pixel grid size and repeating said steps of providing a test pattern using said modified pixel grid size, determining images of said test pattern, determining said numerical error metric of said comparison, until said numerical error metric meets said predetermined criterion.

3. The method according to claim 2, further comprising designing a mask comprising simulating said mask images with a pixel-based model using said last modified pixel grid size.

4. The method according to claim 1, wherein said feature widths within said row range at least from a minimum feature width to said minimum feature width plus said pixel grid size.

5. The method according to claim 1, wherein each feature in each row of said plurality of rows is separated from the adjacent feature by a space width along the x-direction, each said space widths differing from other space widths in said row by a multiple of said minimum step size.

6. The method according to claim 1, wherein each feature in each row of said plurality of rows is separated from the adjacent feature by a space width along the x-direction, each said space widths differing from other space widths in said row by a multiple of said minimum step size, and wherein said space widths with said row range at least from a minimum spacing to said minimum spacing plus said pixel grid size.

7. The method according to claim 1, wherein said pixel grid size is equal to $$\frac{\lambda}{k4NA},$$

where $\lambda$ is the illumination wavelength of the lithographic process, NA is numerical aperture of the lithographic process, and k is a pixel scaling factor, and said step of providing said pixel grid size comprises providing a value of k.

8. The method according to claim 7, wherein k has a value between about 1.5 to 2.

9. The method according to claim 1, wherein said features are rectangular.

10. The method according to claim 1, wherein said features have a feature length along the y-direction and said features have a feature length to feature width aspect ratio that is resolvable by an optical mask inspection tool.

11. The method according to claim 1, wherein said features have a feature length along the y-direction and said features have a feature length to feature width aspect ratio that is at least 4:1.

12. The method according to claim 1, wherein said metric comprises a difference in edge placement.

13. The method according to claim 12, wherein said criterion comprises the condition that said difference in edge placement is less than or equal to two times said minimum step size.

14. The computer program product according to claim 1, wherein said metric comprises image intensity.

15. The computer program product according to claim 1, wherein said step of determining images of said test pattern comprises using a lithographic process model that is a fast approximation of a final lithographic process model to be used in mask design.

16. The computer program product according to claim 1, wherein said step of determining images of said test pattern comprises using a lithographic process model that is a fast approximation of a final lithographic process model to be used in mask design.

17. A computer program product comprising a non-transitory computer readable storage medium having stored therein computer readable instructions which when executed by a computer cause the computer to perform method steps for designing a mask including using pixel-based model for simulating a lithographic process, the method comprising the steps of:

providing a minimum step size for modifying mask shapes;

selecting a pixel grid size larger than said minimum step size;

providing a test pattern comprising a plurality of rows of features, wherein each row of features is separated from an adjacent row of features along a y-direction orthogonal to an x-direction by a y-separation greater than or equal to a region of influence, and wherein each row of said plurality of rows comprises the same sequence of a plurality of features, and wherein a starting location of each row is offset along the x-direction from the starting location of each of other adjacent rows of said plurality of rows by an x-separation that is different for each pair of rows and said x-separation ranges from said minimum step size to at least said pixel grid size by an integer multiple of said minimum step size;

determining images of said test pattern using said pixel grid size;

determining a numerical error metric of a comparison between said image of a reference row with said image of each other row in said test pattern; and determining whether said numerical error metric violates a predetermined criterion.

18. The computer program product according to claim 17, further comprising computer readable instructions for performing the method steps of, if said metric violates said predetermined criterion, then modifying said pixel grid size and repeating said steps of designing a test pattern using said modified pixel grid size, determining images of said test pattern, determining said numerical error metric, and comparing said numerical error metric to said predetermined criterion until said numerical error metric meets said predetermined criterion.

19. The computer program product according to claim 18, further comprising computer readable instructions for performing the method step of designing a mask comprising simulating said mask images with a pixel-based model using said last modified pixel grid size.

20. The computer program product according to claim 17, wherein said feature widths within said row range at least from a minimum feature width to said minimum feature width plus said pixel grid size.

21. The computer program product according to claim 17, wherein each feature in each row of said plurality of rows is separated from the adjacent feature by a space width along the x-direction, each said space widths differing from other space widths in said row by a multiple of said minimum step size.

22. The computer program product according to claim 17, wherein each feature in each row of said plurality of rows is separated from the adjacent feature by a space width along the x-direction, each said space widths differing from other space widths in said row by a multiple of said minimum step size, and wherein said space widths with said row range at least from a minimum spacing to said minimum spacing plus said pixel grid size.

23. The computer program product according to claim 17, wherein said pixel grid size is equal to $$\frac{\lambda}{k4NA},$$

where $\lambda$ is the illumination wavelength of the lithographic process, NA is numerical aperture of the lithographic process, and k is a pixel scaling factor, and said step of providing said pixel grid size comprises providing a value of k.

24. The computer program product according to claim 23, wherein k has a value between about 1.5 to 2.

25. The method according to claim 17, wherein said features are rectangular.

26. The computer program product according to claim 17, wherein said features have a feature length along the y-direction and said features have a feature length to feature width aspect ratio that is resolvable by an optical mask inspection tool.

27. The computer program product according to claim 17, wherein said features have a feature length along the y-direction and said features have a feature length to feature width aspect ratio that is at least 4:1.

28. The computer program product according to claim 17, wherein said metric comprises a difference in edge placement.

29. The computer program product according to claim 17, wherein said metric comprises image intensity.

30. A method of designing a mask including using pixel-based model for simulating a lithographic process, the method comprising the steps of:

providing a minimum step size for modifying mask shapes;

selecting a pixel grid size larger than said minimum step size;

providing a test pattern comprising a plurality of rows of features, wherein each row of features is separated from an adjacent row of features along a y-direction orthogonal to an x-direction by a y-separation greater than or equal to a region of influence, and wherein each row of said plurality of rows comprises the same sequence of a plurality of features, wherein said features each have a feature width along said x-direction, and each of said feature widths within each row differ from every other feature width within said row by a multiple of said minimum step size, and wherein a starting location of each row is offset along the x-direction from the starting location of each of other rows of said plurality of rows by an x-separation that is different for each pair of rows and said x-separation ranges from said minimum step size to at least said pixel grid size by an integer multiple of said minimum step size;

determining, by a processor, images of said test pattern using said pixel grid size;

determining a numerical error metric of a comparison between said image of a reference row with said image of each other row in said test pattern; and designing said mask using said pixel grid size if said numerical error metric meets a predetermined criterion.

31. A method of designing a mask including using pixel-based model for simulating a lithographic process, the method comprising the steps of:

providing a minimum step size for modifying mask shapes;

selecting a pixel grid size larger than said minimum step size;

providing a test pattern comprising a plurality of rows of features, wherein each row of features is separated from an adjacent row of features along a y-direction orthogonal to an x-direction by a y-separation greater than or equal to a region of influence, and wherein each row of said plurality of rows comprises the same sequence of a plurality of features, and wherein a starting location of each row is offset along the x-direction from the starting location of each of other rows of said plurality of rows by an x-separation that is different for each pair of rows and said x-separation ranges from said minimum step size to at least said pixel grid size by an integer multiple of said minimum step size;

determining, by a processor, images of said test pattern using said pixel grid size;

determining a numerical error metric of a comparison between said image of a reference row with said image of each other row in said test pattern wherein said metric comprises a difference in edge placement, wherein said criterion comprises the condition that said difference in edge placement is less than or equal to two times said minimum step size; and designing said mask using said pixel grid size if said numerical error metric meets a predetermined criterion.

32. A computer program product comprising a non-transitory computer readable storage device having stored therein computer readable instructions which when executed by a computer cause the computer to perform method steps for designing a mask including using pixel-based model for simulating a lithographic process, the method comprising the steps of:

providing a minimum step size for modifying mask shapes;

selecting a pixel grid size larger than said minimum step size;

providing a test pattern comprising a plurality of rows of features, wherein each row of features is separated from an adjacent row of features along a y-direction orthogonal to an x-direction by a y-separation greater than or equal to a region of influence, and wherein each row of said plurality of rows comprises the same sequence of a plurality of features, wherein said features each have a feature width along said x-direction, and each of said feature widths within each row differ from every other feature width within said row by a multiple of said minimum step size, and wherein a starting location of each row is offset along the x-direction from the starting location of each of other adjacent rows of said plurality of rows by an x-separation that is different for each pair of rows and said x-separation ranges from said minimum step size to at least said pixel grid size by an integer multiple of said minimum step size;

determining images of said test pattern using said pixel grid size;

determining a numerical error metric of a comparison between said image of a reference row with said image of each other row in said test pattern; and determining whether said numerical error metric violates a predetermined criterion.

33. A computer program product comprising a non-transitory computer readable storage device having stored therein computer readable instructions which when executed by a computer cause the computer to perform method steps for designing a mask including using pixel-based model for simulating a lithographic process, the method comprising the steps of:

providing a minimum step size for modifying mask shapes;

selecting a pixel grid size larger than said minimum step size;

providing a test pattern comprising a plurality of rows of features, wherein each row of features is separated from an adjacent row of features along a y-direction orthogonal to an x-direction by a y-separation greater than or equal to a region of influence, and wherein each row of said plurality of rows comprises the same sequence of a plurality of features, wherein said features each have a feature width along said x-direction, and each of said feature widths within each row differ from every other feature width within said row by a multiple of said minimum step size, and wherein a starting location of each row is offset along the x-direction from the starting location of each of other adjacent rows of said plurality of rows by an x-separation that is different for each pair of rows and said x-separation ranges from said minimum step size to at least said pixel grid size by an integer multiple of said minimum step size;

determining images of said test pattern using said pixel grid size;

determining a numerical error metric of a comparison between said image of a reference row with said image of each other row in said test pattern; and determining whether said numerical error metric violates a predetermined criterion.

* * * * *